United States Patent
Strang

(10) Patent No.: US 7,263,447 B2
(45) Date of Patent: Aug. 28, 2007

(54) METHOD AND APPARATUS FOR ELECTRON DENSITY MEASUREMENT AND VERIFYING PROCESS STATUS

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 410 days.

(21) Appl. No.: 10/495,864

(22) PCT Filed: Jan. 30, 2003

(86) PCT No.: PCT/US03/01070

§ 371 (c)(1),
(2), (4) Date: May 18, 2004

(87) PCT Pub. No.: WO03/065131

PCT Pub. Date: Aug. 7, 2003

(65) Prior Publication Data

US 2005/0030003 A1    Feb. 10, 2005

Related U.S. Application Data

(60) Provisional application No. 60/352,502, filed on Jan. 31, 2002.

(51) Int. Cl.
*C23C 16/00* (2006.01)
*G01F 1/00* (2006.01)
(52) U.S. Cl. .................. 702/49; 118/723 MW
(58) Field of Classification Search .......... 702/49
See application file for complete search history.

(56) References Cited

U.S. PATENT DOCUMENTS

| | | | |
|---|---|---|---|
| 3,572,948 A | | 3/1971 | Catherin |
| 4,888,554 A | | 12/1989 | Hyde et al. |
| 5,453,125 A | | 9/1995 | Krogh |
| 6,123,983 A | * | 9/2000 | Smith et al. .............. 427/10 |
| 6,447,937 B1 | | 9/2002 | Murakawa et al. |
| 2004/0232920 A1 | * | 11/2004 | Strang et al. ............. 324/644 |

OTHER PUBLICATIONS

Verdeyen, J. T., Johnson, W. L., Sirkis, M. D., "Electron Density Measurement and Plasma Process Control System Using a Microwave Oscillator Locked to an Open Resonator Containing the Plasma," WIPO, WO 01/06402 A1, Jan. 25, 2001, all pages.*

* cited by examiner

*Primary Examiner*—John Barlow
*Assistant Examiner*—Lisa Sievers
(74) *Attorney, Agent, or Firm*—Oblon, Spivak, McClelland, Maier & Neustadt, P.C.

(57) ABSTRACT

An equipment status monitoring system and method of operating thereof is described. The equipment status monitoring system includes at least one microwave mirror in a plasma processing chamber forming a multi-modal resonator. A power source is coupled to a mirror and configured to produce an excitation signal extending along an axis generally perpendicular to a substrate. A detector is coupled to a mirror and configured to measure an excitation signal. A control system is connected to the detector that compares a measured excitation signal to a normal excitation signal in order to determine a status of the material processing equipment.

36 Claims, 12 Drawing Sheets

METHOD AND APPARATUS FOR ELECTRON DENSITY MEASUREMENT AND VERIFYING PROCESS STATUS

CROSS-REFERENCE TO RELATED APPLICATIONS

The present application claims priority to U.S. application Ser. No. 60/352,502, filed on Jan. 31, 2002, the entire contents of which are herein incorporated by reference. The present application is related to co-pending International Application No. PCT/US00/19539, Publication No. WO 01/06402, published on Jan. 25, 2001; International Application No. PCT/US00/19536, Publication No. WO 01/06544, published on Jan. 25, 2001; International Application No. PCT/US00/19535, Publication No. WO 01/06268, published on Jan. 25, 2001; International Application No. PCT/US00/19540, Publication No. WO 01/37306, published on May 25, 2001; U.S. Application No. 60/330,518, entitled "Method and apparatus for wall film monitoring", filed on Oct. 24, 2001; U.S. Application No. 60/330,555, entitled "Method and apparatus for electron density measurement", filed on Oct. 24, 2001; co-pending U.S. Application No. 60/352,504, entitled "Method and apparatus for monitoring and verifying equipment status," filed on Jan. 31, 2002; co-pending U.S. Application No. 60/352,546, entitled "Method and apparatus for determination and control of plasma state," filed on Jan. 31, 2002; and co-pending U.S. Application No. 60/352,503, entitled "Apparatus and method for improving microwave coupling to a resonant cavity," filed on Jan. 31, 2002. The contents of these applications are incorporated herein by reference.

BACKGROUND OF THE INVENTION

1. Field of the Invention

The present invention generally relates to fabrication of integrated circuits in the semiconductor industry.

2. Discussion of the Background

The fabrication of integrated circuits (IC) in the semiconductor industry typically employs plasma to create and assist surface chemistry within a plasma processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension, etc.).

SUMMARY OF THE INVENTION

The present invention relates to a method and apparatus for monitoring equipment status in a material processing chamber. The present invention advantageously provides a method and apparatus that enables device manufacturers to satisfy more stringent performance requirements for material processing equipment used in the semiconductor industry.

The present invention advantageously provides an equipment status monitoring system for a material processing system. The equipment status monitoring system of the present invention includes at least one multi-modal resonator. The invention further includes a power source coupled to the at least one multi-modal resonator, wherein the power source is configured to produce an excitation signal extending along an axis generally perpendicular to a substrate. Additionally, a detector is coupled to the at least one multi-modal resonator, wherein the detector is configured to measure the excitation signal. The invention also includes a control system connected to the detector and configured to provide a comparison of the measured excitation signal with a normal excitation signal corresponding to a normal status, wherein the comparison facilitates the determination of an equipment status.

The present invention further advantageously provides a method of monitoring a status of a material processing system. The material processing system includes a chamber, at least one multi-modal resonator positioned in relation to the chamber, a power source coupled to the at least one multi-modal resonator to produce an excitation signal extending along an axis generally perpendicular to a substrate, and a detector coupled to the at least one multi-modal resonator. The method of the present invention includes the steps of sweeping an output frequency of the power source in order to produce the excitation signal, recording the excitation signal using the detector, comparing the excitation signal to a normal excitation signal, and determining the status of the material processing system from the comparison of the measured excitation signal and the normal excitation signal.

The present invention further advantageously provides a method of altering the status of the material processing system by adjusting at least one of a chamber condition and a process recipe.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1:
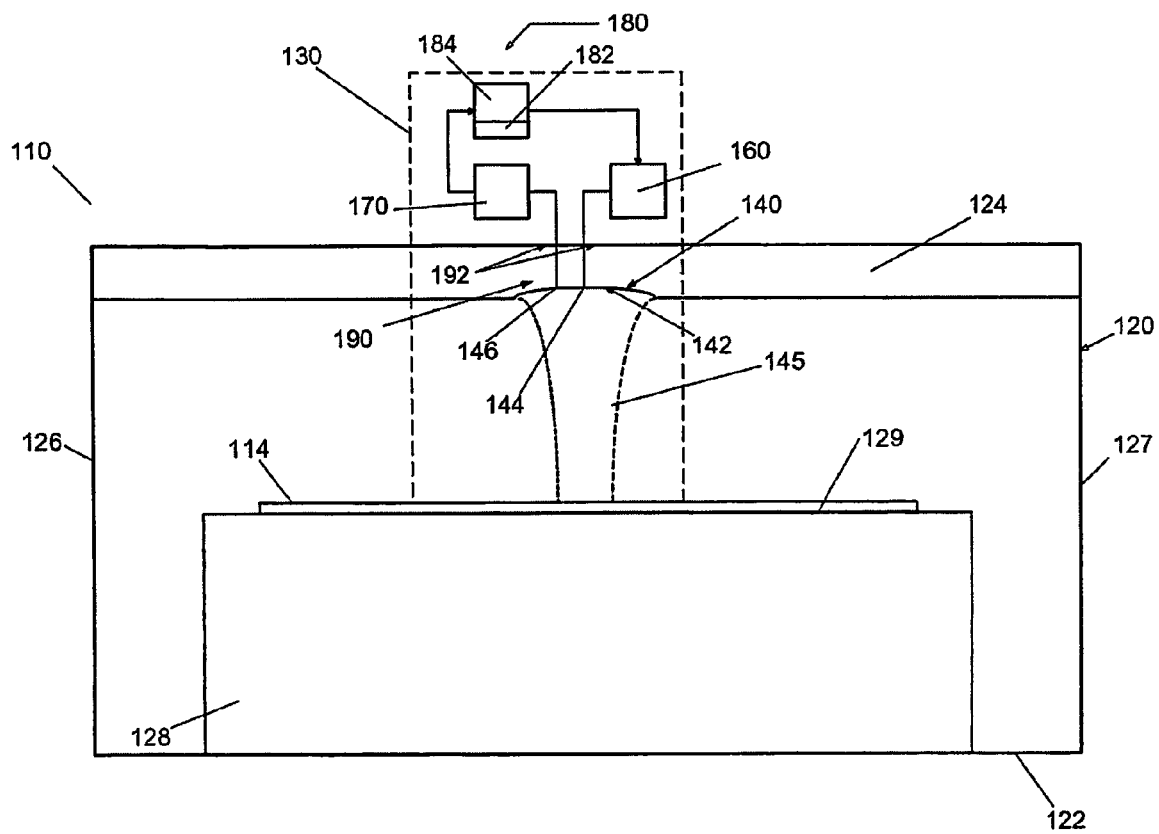
FIG. 1 is a schematic view of an electron density measurement system for a plasma processing chamber according to an embodiment of the present invention.

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

A method of improving the performance of material processing equipment is to monitor and control plasma electron density within the processing chamber during the manufacturing process. Ideally, the plasma electron density is maintained such that the processes being performed are uniformly acting upon the entire surface of the substrate upon which work is being performed.

An exemplary device used to measure plasma electron density is a microwave system of suitably high frequency to exceed the electron plasma frequency. The device includes at least one reflecting surface immersed in the plasma. Microwave power is coupled to a multi-modal resonator (e.g. open resonant cavity) and a detector is utilized to monitor the transmission of microwave power through the multi-modal resonator. For a Gaussian beam, cavity transmission occurs at discrete frequencies, and the discrete frequencies correspond to an integer number of half wavelengths between the apex of each mirror, as expressed by the following equation:

$$v_{m,n,q} = v_{0,0,q} = \frac{c}{2\eta d}\left(q + \frac{1}{2}\right), \quad (1)$$

where $v_{0,0,q}$ is a resonant frequency of mode order q (assuming only longitudinal modes, i.e. m=n=0), c is the speed of light in a vacuum, η is the index of refraction for the medium bounded by the mirrors and d is the mirror spacing (apex-to-apex) for the multi-modal resonator. For a vacuum, η=1, however, the presence of plasma or, more specifically, a population of free electrons leads to a reduction of the index of refraction or an observable increase (shift) of the cavity resonance frequencies $v_{0,0,q}$. For a given mode q, the shift in frequency can be related to the index of refraction n and, thereafter, the (integrated) electron density $<n_e>$, is expressed by the following equation:

$$\langle n_e \rangle \cong \frac{8\pi^2 \varepsilon_o}{e^2} v_o \Delta v, \quad (2)$$

for $v_o \gg \omega_{pe}/2\pi$. For further details, the use of the above system to measure plasma electron density is described in International App. No. PCT/US00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in their entirety.

An apparatus is now described that enables real-time spatial resolution of the electron density. In an embodiment depicted in FIG. 1, a monitoring system 130 is aligned substantially perpendicular to the wafer plane 129 wherein a first reflecting surface is immersed in the plasma within an upper wall opposite a second reflecting surface. The monitoring system 130 can be, for example, a multi-modal resonator. The first reflecting surface can be, for example, a microwave mirror 140 and the second reflecting surface can be, for example, a substrate 114 and/or substrate holder 128.

An embodiment of a plasma processing system 110 as depicted in FIG. 1 includes a plasma chamber 120 and a monitoring system 130 for use in the plasma chamber 120. The monitoring system 130 generally includes a microwave mirror 140, a power source 160, a detector 170, and a control system 180. The plasma chamber 120 generally includes a base wall 122, an upper wall 124, and side-walls including a first side wall 126 and a second side wall 127. The plasma chamber 120 also includes a substrate holder (or chuck assembly) 128 having a wafer plane 129, such as an upper surface of the substrate holder 128 upon which a substrate 114 is positioned in order to be processed within the plasma chamber 120.

The microwave mirror 140 can have, for example, a concave surface 142 and is provided within the plasma chamber 120. In the embodiment depicted in FIG. 1, the mirror 140 is integrated within the upper wall 124 of the plasma chamber 120. The concave surface 142 of the microwave mirror 140 is oriented opposite the substrate holder 128.

The power source 160 is coupled to the microwave mirror 140 and is configured to produce a microwave signal. The microwave signal or microwave beam 145 produced by the power source 160 extends in a direction generally perpendicular to a wafer plane 129 of a substrate holder 128 adapted to be provided within the plasma chamber 120. The embodiment of the monitoring system 130 depicted in FIG. 1 also includes the detector 170 coupled to the microwave mirror 140. The detector 170 is configured to measure a voltage related to the microwave signal within the plasma chamber 120. The control system 180 is connected to the detector 170 and is configured to measure a first voltage during a vacuum condition, measure a second voltage during a plasma condition, and determine an electron density from the difference between the first and second measured voltages. The control system 180 that includes a lock-on circuit 182 connected to the power source 160 and the detector 170, and can additionally include a computer connected to the lock-on circuit 182.

The upper wall 124 of the chamber 120 includes a waveguide aperture 144 configured to couple the power source 160 to the microwave mirror 140, and a detector aperture 146 configured to couple the detector 170 to the microwave mirror 140. Microwave window assemblies 190 each including a microwave window 192 are provided for both the waveguide aperture 144 and the detector aperture 146. The microwave window assemblies 190 can be implemented like the microwave window assembly depicted in FIG. 3 to be described below. The microwave windows are implemented to maintain vacuum integrity. Alternately, separate mirrors can be provided for the power source 160 and the detector 170.

Figure 2:
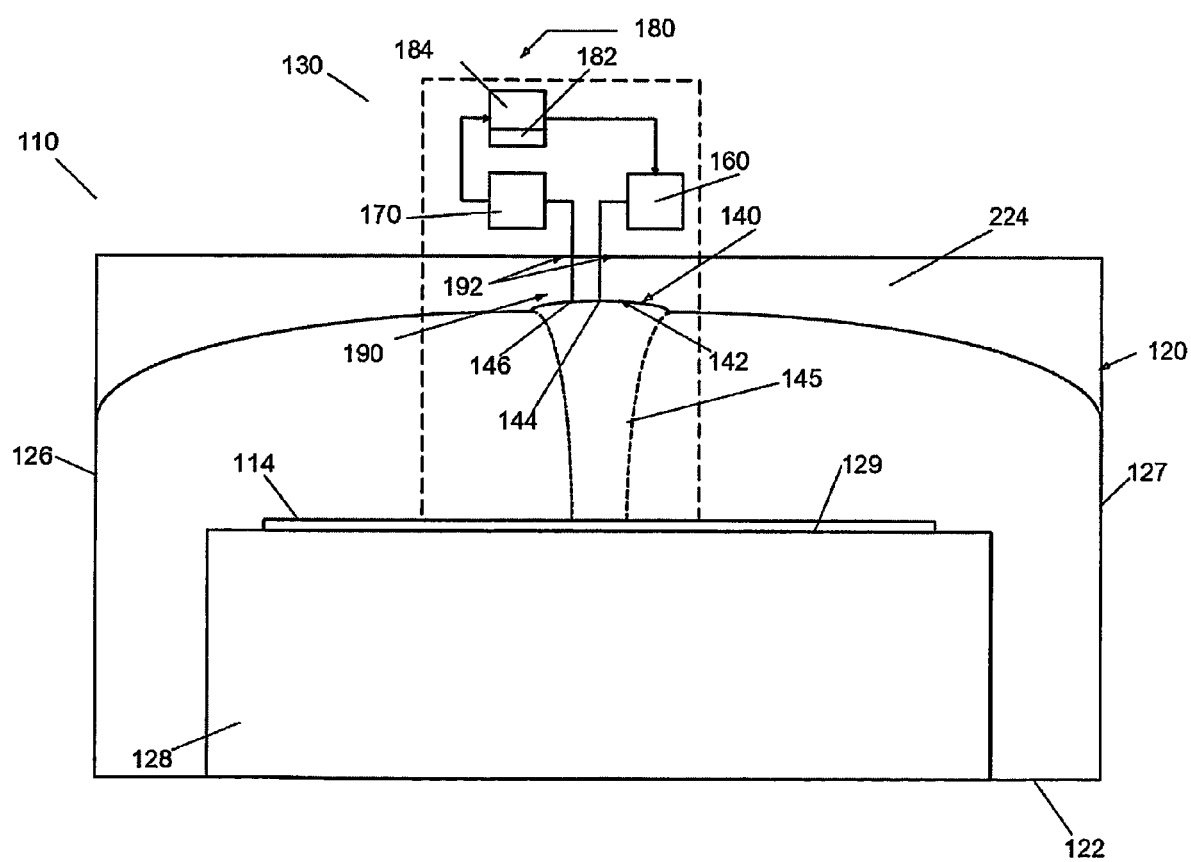
FIG. 2 is a schematic view of an electron density measurement system for a plasma processing chamber according to an embodiment of the present invention.

In an alternate embodiment as depicted in FIG. 2, the upper wall 224 of process chamber 120 can comprise an inner domed surface within which a monitoring system 130 can be formed. In an alternate embodiment, the chamber 120 can be frusto-conical.

Figure 3:
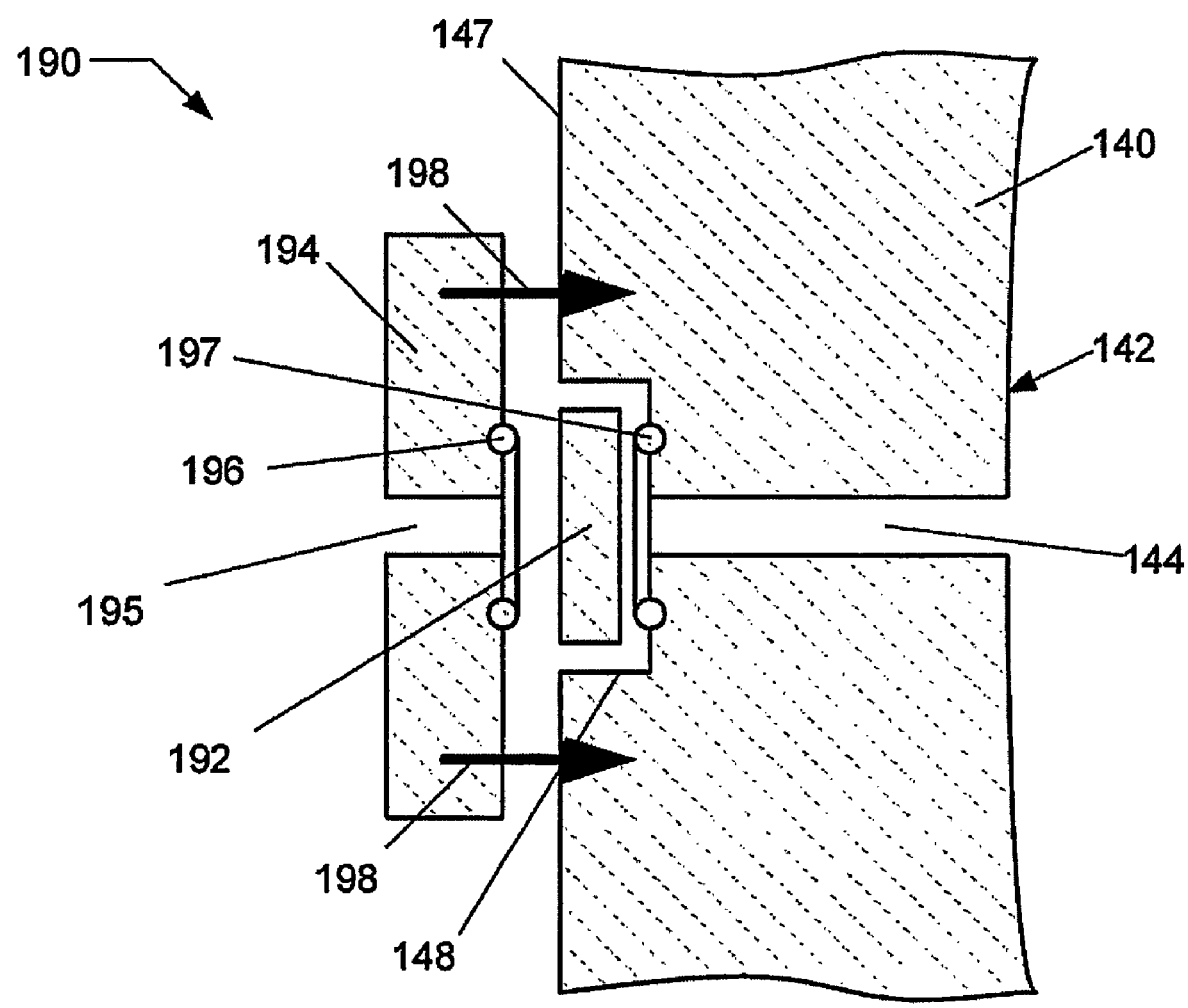
FIG. 3 is an enlarged, exploded, cross-sectional view of a microwave mirror having an aperture, a microwave window and associated mounting structure.

FIG. 3 depicts a detailed schematic of a microwave window assembly 190 for mirror 140, which is used to provide a coupling from the power source 160 through aperture 144. A window assembly 190 having an identical structure is preferably provided for the second aperture 146 in mirror 140, which is used to provide a coupling to the detector 170.

The microwave window assembly 190 depicted in FIG. 3 includes a microwave window 192 that is fastened between a window flange 194 and a rear surface 147 of the microwave mirror 140. In the embodiment depicted in FIG. 3, the window 192 is provided within a recessed portion 148 on the rear surface 147 of microwave mirror 140. The microwave window 192 is provided between a first O-ring 196 provided on the window flange 194 and a second O-ring 197 provided on the rear surface 147 of microwave mirror 140. A plurality of fasteners 198 are provided to mechanically connect the window flange 194 to microwave mirror 140 such that the microwave window 192 is securely mounted to the rear surface 147 of microwave mirror 140. The window 192 is centered on a waveguide aperture 195 extending through the window flange 194 and the waveguide aperture 144 extending through microwave mirror 140. The rectangular waveguide apertures 144 and 195 are sized for a specific microwave band of operation and are fabricated using Electrical Discharge Machining (EDM). The microwave window 192 is fabricated from a dielectric material such as alumina, sapphire, aluminum nitride, quartz, polytetrafluoroethylene (PTFE/Teflon), or Kapton. The window 192 is preferably fabricated from sapphire due to its compatibility with the oxide etch processes.

The microwave mirror 140 is preferably fabricated from aluminum. In alternative embodiments, the microwave mirror 140 is anodized with preferably a 10 to 50 micron thick anodization or coated with a material such as Yttria ($Y_2O_3$).

The microwave power source 160 is preferably an electronically tunable voltage controlled Gunn diode oscillator (VCO). When the VCO is biased with a direct current voltage, the output frequency can be varied over some spectral range. Therefore, the VCO specifications generally include center frequency, bandwidth and minimum output power. In order to facilitate the use of the above-described system, it is preferred that the VCO bandwidth is at least comparable to the free spectral range (FSR). For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. A 2 GHz bandwidth can be suitable for a spacing (between the upper wall 20 and wafer 35) of approximately 7.5 cm. The bias tuning range can generally extend from +25 V to −25 V, thereby adjusting this bias voltage leads to a change in the output frequency of the VCO. In alternate embodiments, operation at higher frequencies, such as 70 GHz and 105 GHZ, can be achieved using a frequency doubler (MUD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In an additional embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of 0 to −25 V. For small mirror spacing (i.e. <5 cm), a microwave input with sufficient power and large bandwidth could be required. In one embodiment, an active multiplier chain is utilized with a low frequency microwave oscillator to achieve bandwidths as great as plus or minus 12 GHz. For example, an active multiplier chain for use in the range of 75 to 100 GHz is a Model AMC-10-R000 that is commercially available from Millitech, LLC. In general, the power should be sufficiently high to achieve a usable signal-to-noise ratio for the diagnostic, however, the power should not be increased above tens of milliwatts in order to avoid wafer damage.

The detector 170 is preferably a general purpose diode detector such as those commercially available from Millitech, LLC. For example, a DXP-15-RNFW0 and a DXP-10-RNFW0 are general purpose detectors in the V-band (50 to 75 GHz) and W-band (75 to 110 GHz), respectively. The detector detects an excitation signal representing (either linearly or non-linearly) the microwave power transmitted through the multi-model resonator.

Figure 4:
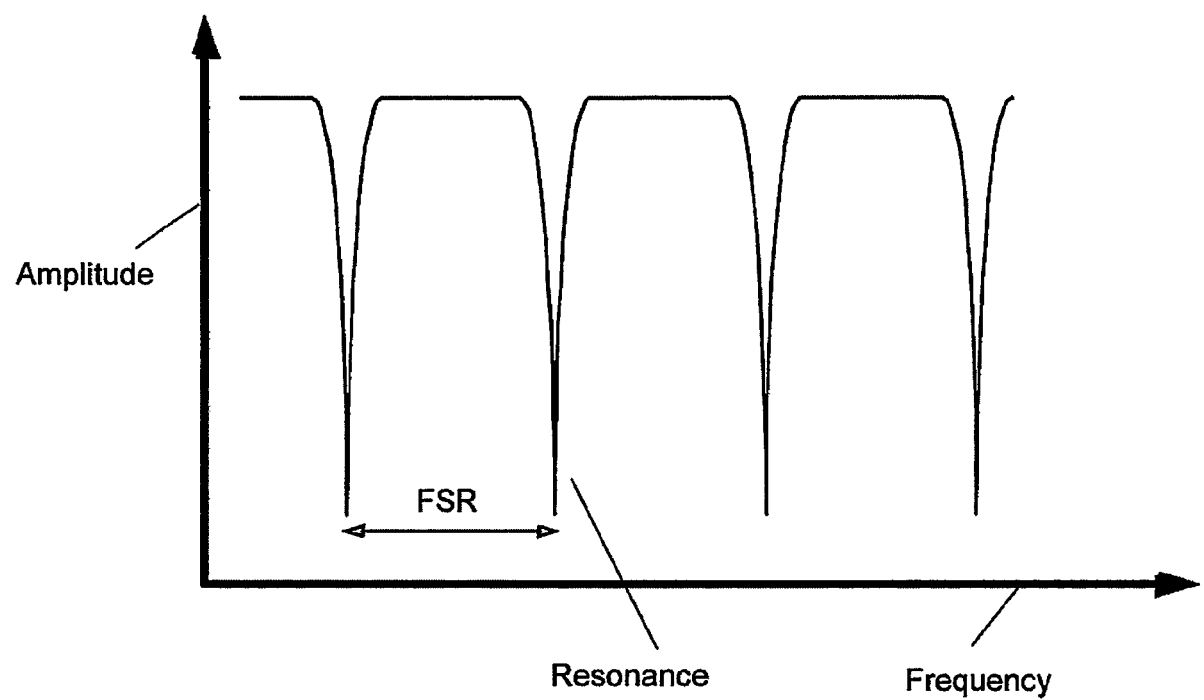
FIG. 4 is a graphical representation of an exemplary cavity transmission function showing several longitudinal resonances and a respective free spectral range.

The embodiment of the present invention depicted in FIG. 1 has a control system 180 that includes a lock-on circuit 182 connected to the power source 160 and the detector 170, and a computer 184 connected to the lock-on circuit 182. The lock-on circuit 182 can be utilized to lock the frequency of the microwave signal output from the microwave power source 160 to a pre-selected cavity resonance. The lock-on circuit 182 superimposes a dither signal (e.g. 1 kHz, 10 mV amplitude square wave) on a direct current voltage substantially near the voltage and related output VCO frequency that corresponds with a pre-selected longitudinal frequency in the monitoring system 130 of FIG. 1 (i.e. when the output frequency falls within the resonance envelope, an error signal can be produced to move the output frequency of the VCO to the frequency associated with the resonance peak). The signal detected by the detector 170 is provided to the lock-on circuit 182, where it represents a first derivative of the cavity transmission function (transmitted power versus frequency). The signal input to the lock-on circuit 182 from the detector 170 provides an error signal by which the direct current component of the VCO bias voltage is adjusted to drive the VCO output frequency to the frequency associated with the peak of a pre-selected longitudinal resonance as shown in FIG. 4. FIG. 4 presents an exemplary cavity transmission function (from a negative polarity detector)

indicating several longitudinal resonances and the respective free spectral range (FSR). The cavity transmission as shown in FIG. 4 can be obtained by sweeping the VCO across a suitable frequency range sufficiently greater than the FSR.

As described above, the introduction of plasma within the chamber 120 causes a shift in frequency for each of the resonances shown in FIG. 4 (i.e. each of the resonances shift to the right in FIG. 4 when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in wafer processing, the direct current bias voltage is recorded once a new wafer is received by the process tool for materials processing and prior to the ignition of plasma. Hereinafter, this measurement will be referred to as the vacuum resonance voltage. Once the plasma is formed, the direct current bias voltage is obtained as a function of time for the given wafer and the time varying voltage difference or ultimately electron density (via equation (2)) is recorded.

Figure 5:
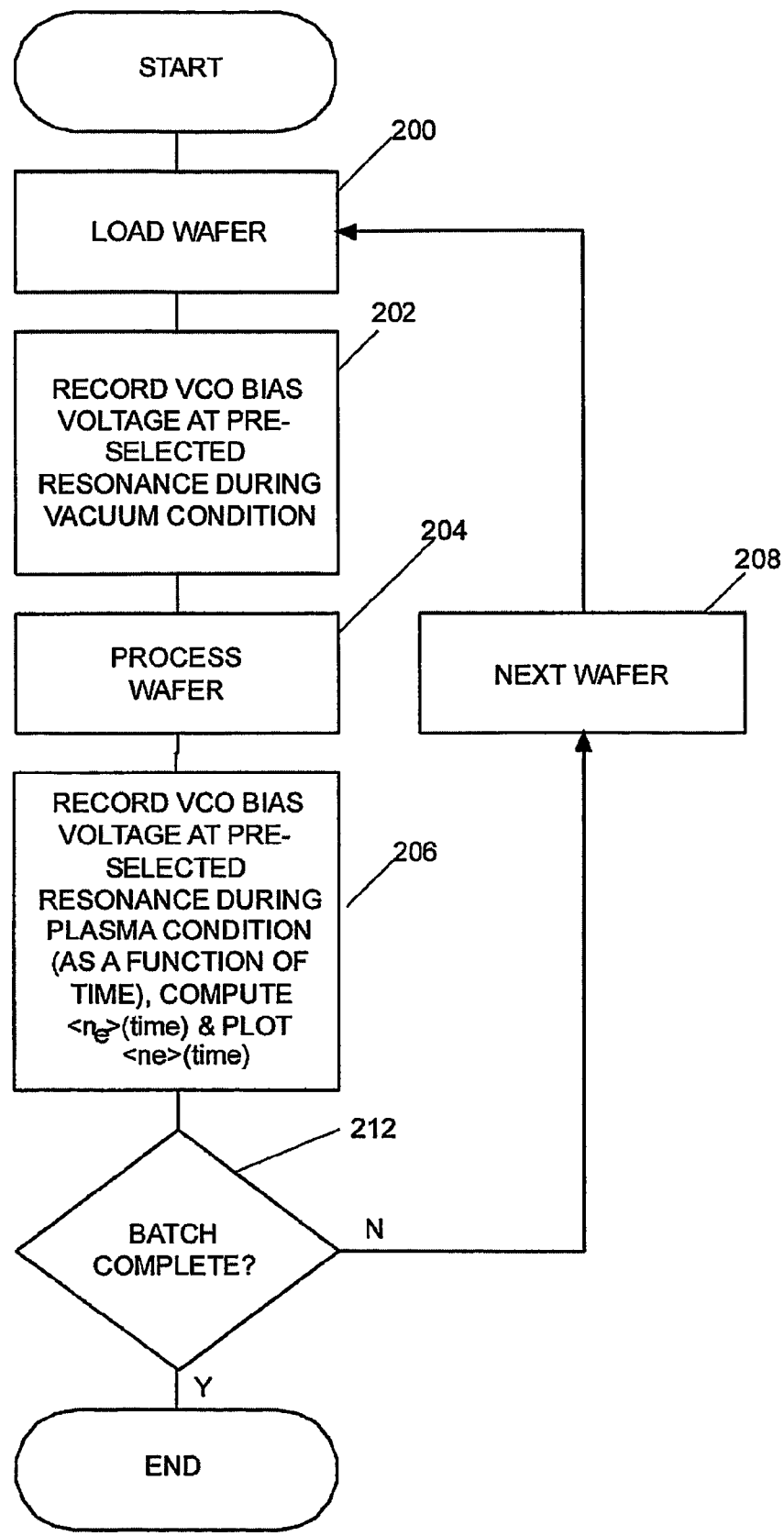
FIG. 5 is a flow diagram of a method of monitoring electron density in a plasma processing chamber according to an embodiment of the present invention.

FIG. 5 is a flowchart of a method of monitoring the bias voltage representative of electron density from wafer-to-wafer utilizing the systems described in FIGS. 1 and 2. The process begins with a step 200 of loading a wafer and preparing the chamber for process conditions (i.e. evacuating the chamber, initiating gas flow, etc.). Once the wafer is loaded, a cavity resonance is selected and the lock-on circuit is programmed to lock the VCO output frequency to the selected resonant frequency. The VCO bias voltage corresponding to the pre-selected resonance during a vacuum condition is measured in step 202 and the process proceeds according to a process recipe stored on the process computer in step 204. During the process in step 206, a second VCO bias voltage under a plasma condition is measured as a function of time, a difference between the second VCO bias voltage and the first VCO bias voltage is computed as a function of time, an electron density is determined from the voltage difference per equation (2), and the electron density is displayed through a graphical user interface (GUI) as a function of time during the process. The measurements of steps 202 and 206 can be, for example, a single signal comprising the measured voltage as a function of time. When the process is complete, the status of the batch is evaluated in step 212. If the batch is incomplete, a next wafer is processed in step 208 and steps 200 through 212 are repeated. If the batch is complete in step 212, a subsequent batch can be processed.

The present invention provides a method of monitoring electron density in a plasma chamber, such as that depicted in FIGS. 1 and 2. For example, the plasma chamber 120 includes a microwave mirror 140 having a concave surface 142 located opposite a substrate holder 128 within the plasma chamber 120, a power source 160 coupled to the microwave mirror 140 and configured to produce a microwave signal extending along an axis generally perpendicular to a wafer plane 129 of the substrate holder 128, and a detector 170 coupled to the microwave mirror 140. The method of the present invention includes the steps of loading a wafer 114 in the plasma chamber 120, setting a frequency of a microwave signal output from the power source 160 to a resonance frequency, and measuring a first voltage of the microwave signal during a vacuum condition within the plasma chamber 120 using the detector 170. The method further includes the steps of processing the wafer 114, measuring a second voltage of the microwave signal during a plasma condition within the plasma chamber 120 using the detector 170, and determining an electron density (per equation (2)) from a difference between the second measured voltage and the first measured voltage.

The configuration described above and depicted in FIGS. 1, 2, 3 and 5 enables the measurement of the integrated electron density in a monitoring system 130 within the influence of the microwave beam. In addition to monitoring the integrated plasma density at a single region above substrate 114, an alternate embodiment can be configured to monitor the plasma density at more than one location above substrate 114. The process uniformity which is strongly affected by the uniformity of the plasma density is critical in achieving maximum yield and quality of devices across an entire 200 mm to 300 mm wafer (and larger).

Figure 6:
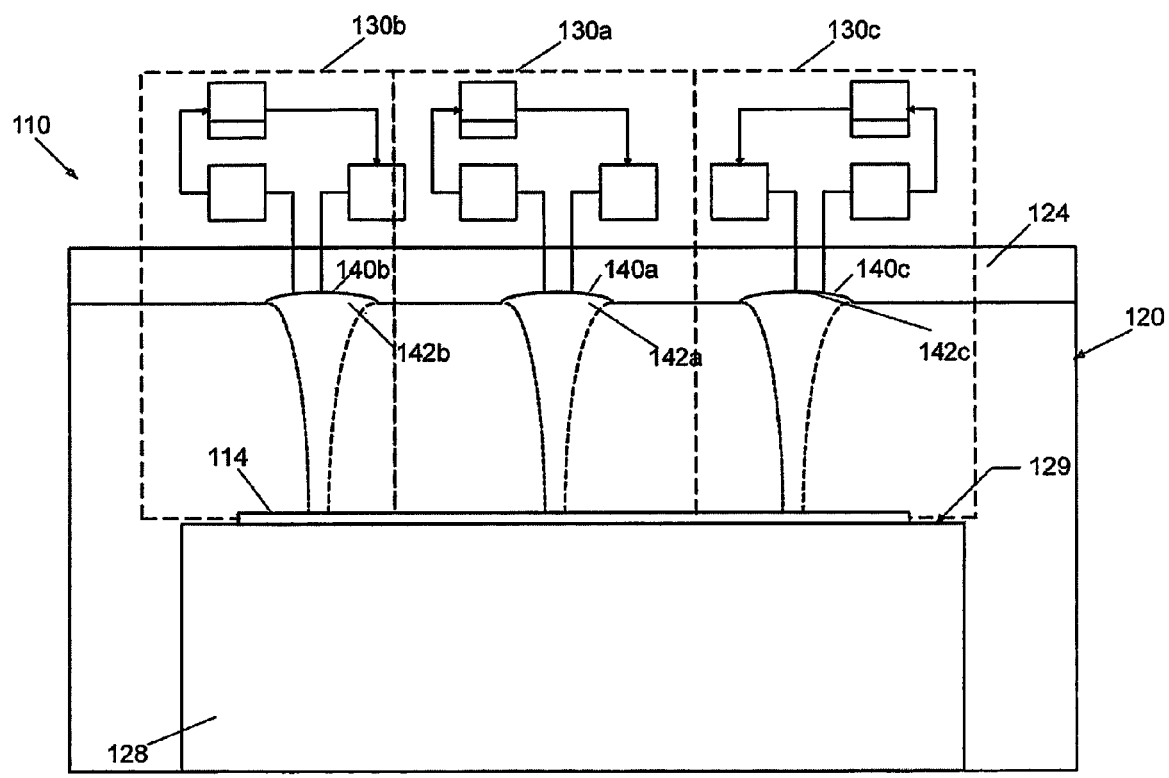
FIG. 6 is a schematic view of a multi-site electron density measurement system for a plasma processing chamber according to an alternative embodiment of the present invention.

In an alternate embodiment as depicted in FIG. 6, a plurality of monitoring systems 130a, 130b, and 130c substantially identical to those described above are employed with respective mirrors 140a, 140b, and 140c to achieve spatially resolved electron density measurements. The plurality of monitoring systems 130a, 130b, and 130c include microwave mirrors 140a, 140b, and 140c that are provided in a spatial array located opposite the substrate holder 128. The monitoring systems of such an array can be operated by simultaneously using the method of monitoring electron density in a plasma chamber as depicted in FIG. 1. In such a configuration, the electron density can be determined at multiple sites above the substrate 114, and these measurements can be, for example, correlated with the process performance parameters (i.e. spatial distribution of etch rate, etch selectivity, etc.). The multi-site measurement of electron density can ultimately be employed to diagnose the uniformity of a process.

In the embodiment depicted in FIG. 6, a linear array of mirrors is provided, however, other configurations of the mirror array can be utilized to provide for an even distribution of monitoring systems above the substrate holder 128, as discussed later with respect to FIG. 9.

Figure 7:
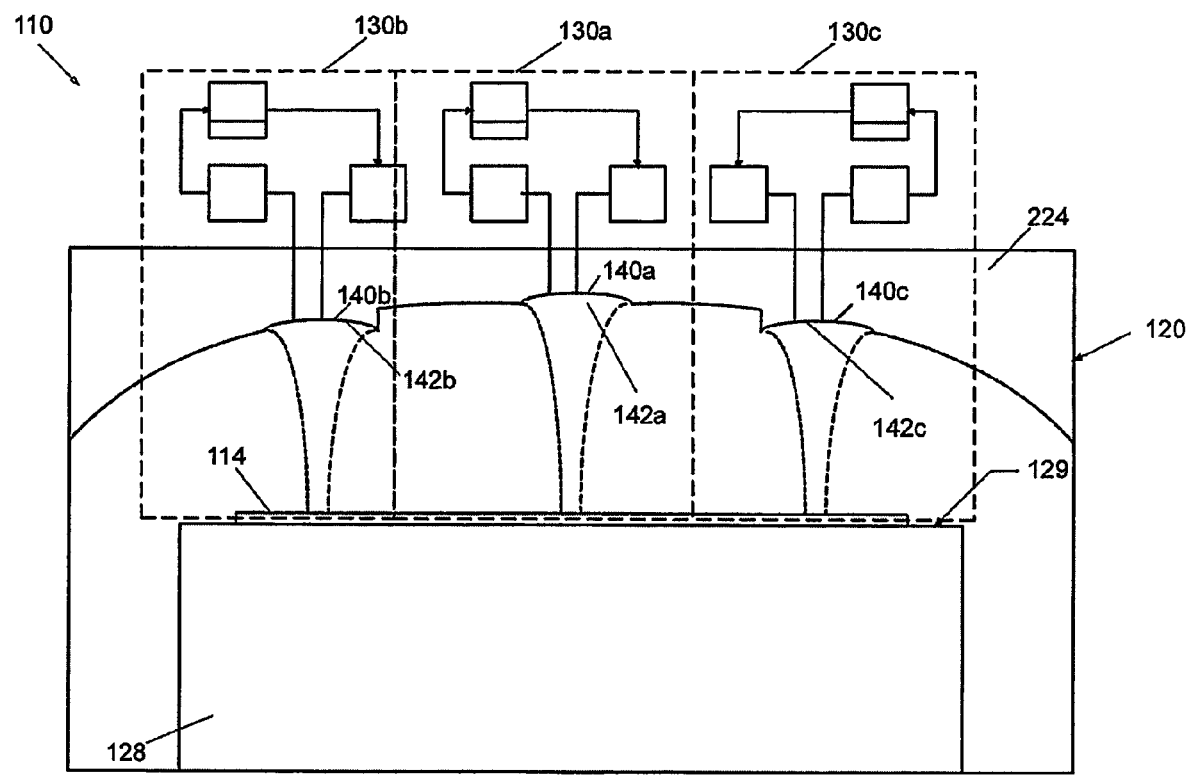
FIG. 7 is a schematic view of a multi-site electron density measurement system for a plasma processing chamber according to an alternative embodiment of the present invention.

In an alternate embodiment as depicted in FIG. 7, the upper wall 224 of process chamber 120 can be curved; a plurality of monitoring systems 130a-c can be formed within the curved wall. In an alternate embodiment, the chamber 120 can be frusto-conical.

Figure 8:
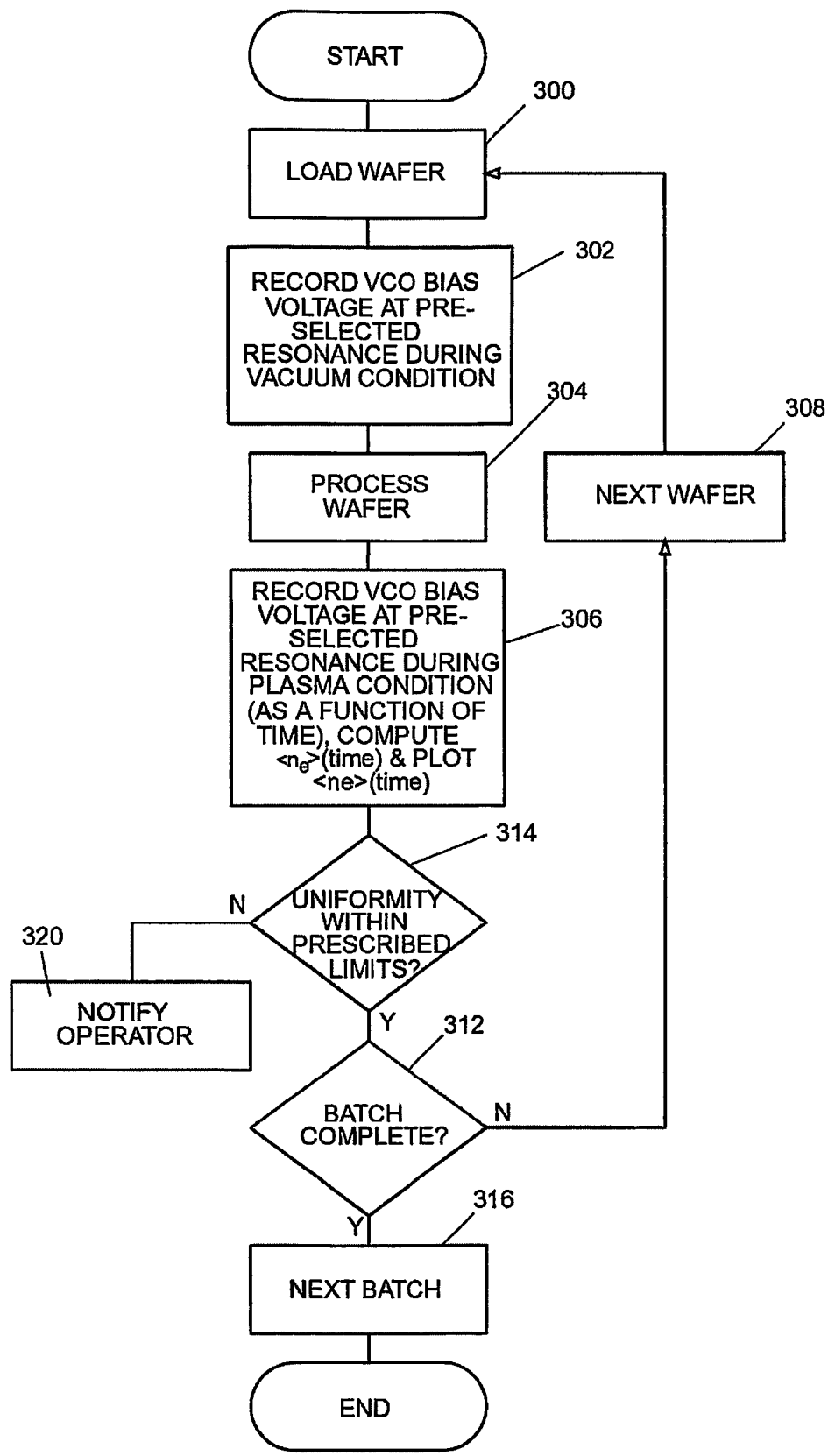
FIG. 8 is a flow diagram of a method of monitoring electron density at multiple sites in a plasma processing chamber according to an embodiment of the present invention.

FIG. 8 is a flowchart of a second method of monitoring the bias voltage representative of electron density from wafer-to-wafer utilizing the system described in FIG. 5. The process begins with a step 300 of loading a wafer and preparing the chamber for process conditions (i.e. evacuating the chamber, initiating gas flow, etc.). Once the wafer is loaded, a cavity resonance is selected and the lock-on circuit is programmed to lock the VCO output frequency to the selected resonant frequency for each multi-modal resonator 130(a-c) in FIGS. 6 and 7. The VCO bias voltage corresponding to the pre-selected resonance during a vacuum condition is measured in step 302 (i.e. for each multi-modal resonator 130a-c) and the process proceeds according to a process recipe stored on the process computer in step 304. During the process in step 306, a second VCO bias voltage under a plasma condition is measured as a function of time, a difference between the second VCO bias voltage and the first VCO bias voltage is computed as a function of time, an electron density is determined from the voltage difference per equation (2), and the electron density is displayed through a graphical user interface (GUI) as a function of time during the process. Step 306 is repeated for each multi-modal resonator (130a-c) in FIGS. 6 and 7. The measurements of steps 302 and 306 can be, for example, a single signal comprising the measured voltage as a function of time. At the completion of processing for a given wafer, the uniformity of the electron density is computed and a determination of whether the uniformity is within prescribed limits is made in step 314. If the uniformity of electron density exceeds the prescribed limit, then an operator is notified in step 320. When the process is complete, the status of the batch is evaluated in step 312. If the batch is incomplete, a next wafer is processed in step 308 and steps 300 through 314 are repeated. If the batch is complete in step 312, a subsequent batch can be processed in step 316.

Figure 9:
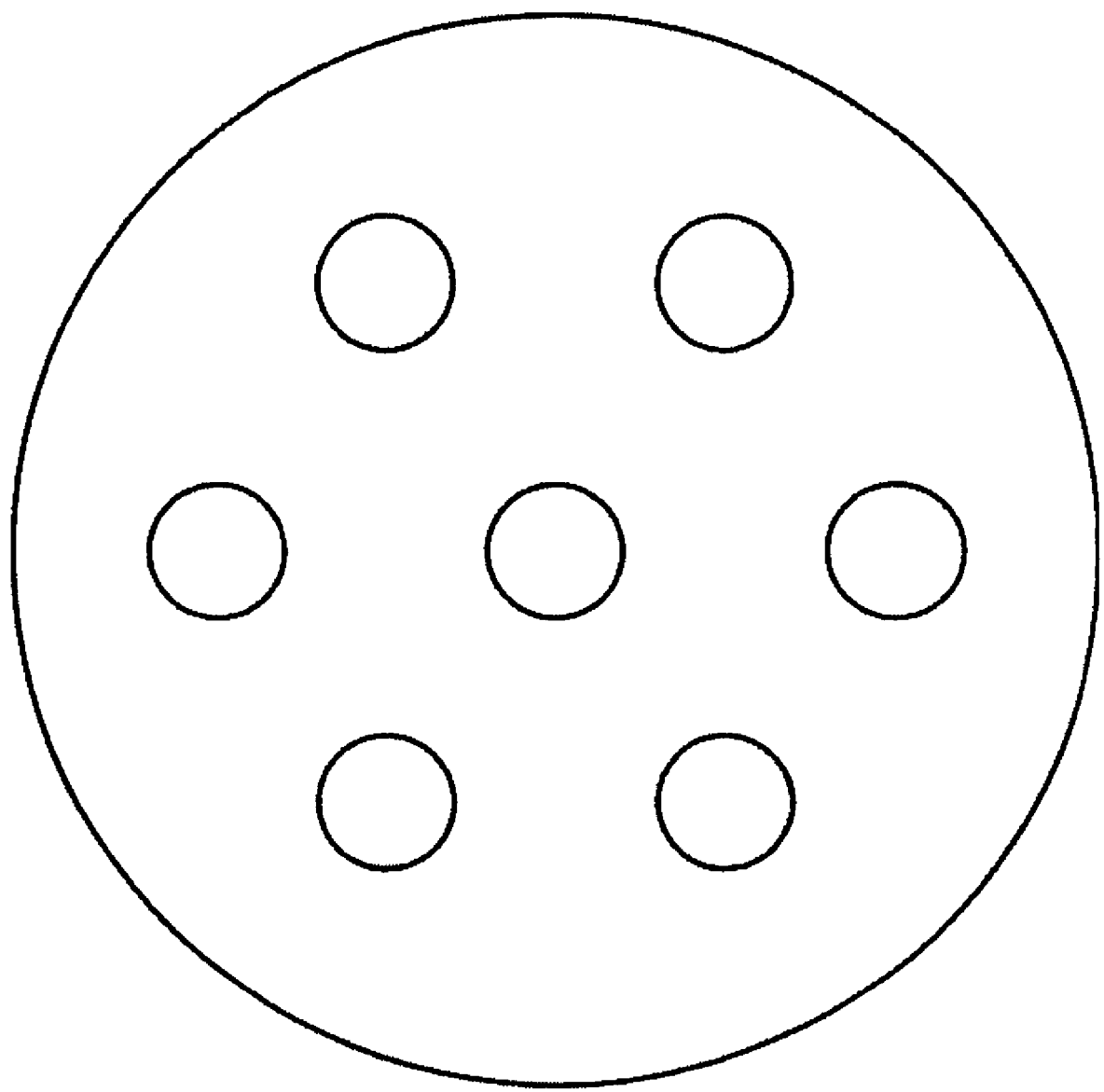
FIG. 9 is a top view of a non-linear mirror configuration for use in a multi-side measurement system according to one embodiment of the present invention.

FIG. 9 is a top view of a multi-side monitoring system. While an array of seven sites is shown, more or fewer sites can be used. The array can be non-linear (as shown in FIG. 9) or linear (as shown in FIGS. 6 and 7). The spacing between sites can be uniform or non-uniform and may vary with radius.

As an alternative to the processes depicted in FIGS. 5 and 8, the processing of a batch can be terminated mid-batch if the uniformity is not within prescribed limits. In such an embodiment, the system tracks which wafers still need to be processed when the wafer cartridge is reloaded.

Returning again to FIG. 4, the frequency spectrum of the cavity transmission is strongly dependent on several properties of the surrounding structures that are in substantial contact with the multi-modal resonator. These properties can include, but are not limited to, diagnostic properties such as, for example, the mirror alignment, size and design; chamber assembly properties such as, for example, the proximity of the chamber structure surrounding the multi-modal resonator and the materials comprising these structures; properties of the substrate such as, for example, the substrate material, thickness and size, and the substrate proximity to the multi-modal resonator; and properties of consumable elements such as size, material and proximity to the multi-modal resonator.

Due to the finite size of the multi-modal resonator, i.e. the diameter of the mirror 140, and the diameter of the related microwave beam that extends between the mirror and substrate, electromagnetic energy "spills" from the periphery of the mirror and interacts with the surrounding structure. Some of this energy is dissipated in the structure and, hence, it is lost to heat; however, some of this energy is scattered from the surrounding structure and re-enters the multi-modal resonator. The scattering of electromagnetic energy by the surrounding structure is very sensitive to the structure geometry, the material type and the proximity of the surrounding structure to the multi-modal resonator. Therefore, it is expected that any change to an above identified property of the surrounding structure can lead to an observable change in the frequency spectrum of cavity resonances; hereinafter referred to as the resonance spectrum (FIG. 4). As described above, a resonance spectrum is one example of an excitation signal produced by sweeping the power source 160.

During processing, i.e. wafer-to-wafer and batch-to-batch, each of the above identified properties is subject to change except for the properties of the diagnostic, which are specifically chosen to be constant. A diagnostic calibration is typically required at each installation, to be discussed below. Several exemplary cases are now described, which will lead in to the description of a method of monitoring an equipment status according to the present invention. By comparing an excitation signal with a normal excitation signal, a change in at least one of a substrate presence, substrate type, substrate location, chamber assembly status and a consumable status can be identified.

Improper assembly of the chamber can lead to a substantive change in the resonance spectrum. For example, if the chamber lid assembly is lifted to replace various components such as the gas injection plate, shield ring, focus ring, etc., an improper alignment, size or assembly of the re-installed component can be detected with a substantive change in the integrated resonance spectrum, for instance, zeroth or first moment (mean or variance), viz.

$$I_0 = \int_{f_1}^{f_2} V_d(f) df$$

or $$I_1 = \int_{f_1}^{f_2} V_d^2(f) df,$$

where $V_d$ is the detector voltage as a function of frequency f. Alternatively, a modal amplitude for a given resonance can be monitored, or net change in modal amplitudes can be monitored.

Figure 10:
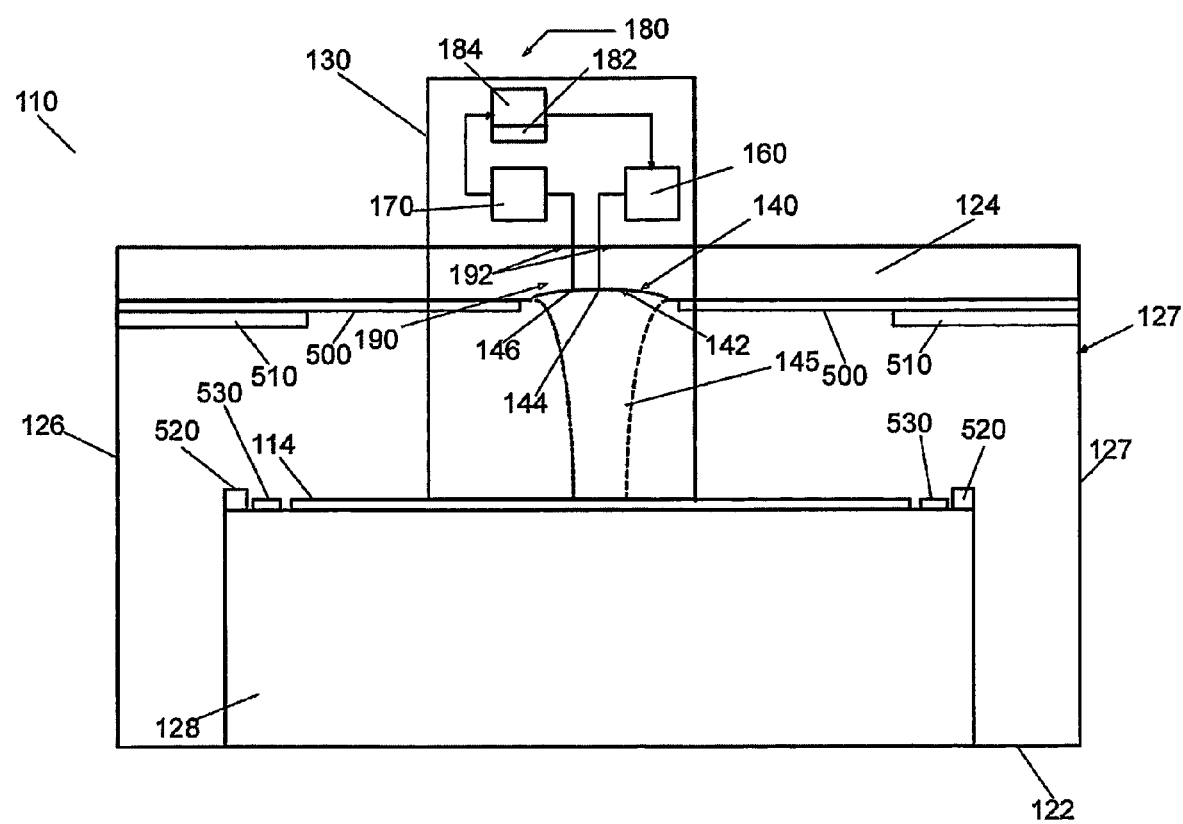
FIG. 10 is a schematic view of an equipment status monitoring system for a material processing chamber according to an embodiment of the present invention.

Improper substrate location can also lead to a substantive change in the resonance spectrum. Frequently, the substrate holder or chuck is translatable within the processing environment and, therefore, capable of vertical movement between a substrate load/unload position and a process position. The substrate load/unload position is generally unchanged; however, the process position can be variable depending upon the process recipe. The proximity of the chuck to the multi-modal resonator has a distinct effect on the resonance spectrum. In general, the free spectral range (FSR), for the geometry of FIG. 1, changes inversely with the chuck position (i.e., FSR is proportional to 1/d, where d is the spacing between the mirror apex and the upper surface of the chuck). Moreover, as the chuck position is changed, the ratio of modal amplitudes in a given, measured resonance spectrum can change depending on the chuck position relative to the multi-modal resonator. Alternatively, a modal amplitude for a given resonance can be monitored, or an $n^{th}$ moment of the resonance spectrum can be monitored. For example, Table I presents the free spectral range as a function of the electrode spacing h (or chuck location). For example, the spacing h can be the distance between substrate 114 and upper wall 124 in FIG. 10.

TABLE I

Effect of chuck location on free spectral range (FSR).

| h (mm) | FSR (GHz) |
|---|---|
| 150 | 1 |
| 50 | 3 |
| 45 | 3.33 |
| 40 | 3.75 |
| 35 | 4.29 |

Referring to Table I, the free spectral range increases for h=150 mm to h=35 mm (see FIG. 4 for an example of a longitudinal resonance and the FSR).

The presence of the substrate as well as other properties such as, for example, the substrate thickness, can be detected due to differences in the observed resonance spectrum with and without a substrate. In general, the presence of a substrate and, more particularly, a silicon substrate leads to a reduction of the modal amplitudes as well as the modal quality factors. The reduction in amplitude can be as great as 10 to 80% (depending upon the substrate material, size and thickness). Therefore, the presence of a substrate can be determined by monitoring at least one modal amplitude. Alternatively, the net change in modal amplitudes of an observed resonance spectrum can be monitored.

Substantial erosion of consumable elements can be detected during their lifetime due to their net effect on the resonance spectrum and, in time, produce a variation of the consumable status. For example, in oxide etch applications, the material processing chamber is generally clad with several consumable elements, such as a silicon gas injection electrode 500, quartz shield rings 510, 520 and a silicon focus ring 530 (see FIG. 10). During substrate processing, these consumable elements erode and, in time, the resonance spectrum can substantially change indicating a point to replace the consumable elements. For example, erosion of the silicon comprising consumable elements can lead to less loss and, therefore, an increase in modal amplitudes or an $n^{th}$ moment of the resonance spectrum, or an increase in a given modal quality factor. Conversely, erosion of the quartz comprising consumable elements can lead to substantive changes in a given, observed resonance spectrum, such as, for example, changes in the ratio of one modal amplitude to another.

Following the trends above, a variation in equipment status as governed by a substrate presence, substrate type, substrate location, chamber assembly status and a consumable status can be detected by comparing a measured excitation signal with a normal excitation signal. In one embodiment, a difference can be detected by comparing at least one modal amplitude. In an alternate embodiment, a difference can be detected by at least one of: a change in a modal amplitude; a net change in the modal amplitudes of a resonance spectrum; a change (including shift) in at least one resonance location(s) (frequency/frequencies) (including a shift in all measured resonance locations); a change in relative spacings between modes (i.e. FSR); a net change in the each of the resonance frequencies; a change in the ratio of one modal amplitude to a second modal amplitude; a change in a (modal) signal quality factor; a change in an integrated property of the excitation signal such as, for example, a zeroth moment, a first moment, a second moment and a third moment; and a change in a differentiated property of the excitation signal such as, for example a slope (first derivative), second derivative, and third derivative. One such change is the change in resonance location (frequency) (e.g., due to buildup of a film or films on the resonator mirror(s) or a temperature effect on the stability of the VCO).

As mentioned above, the diagnostic generally comprises a specific design and, therefore, once the diagnostic is installed within a processing system, the properties of the diagnostic, i.e. size, alignment, etc., are not susceptible to change. At each installation of the diagnostic, either reinstallation, diagnostic upgrade, diagnostic repair, etc., the material processing system, to which it is installed, must be characterized. Therein, the resonance spectrum (or excitation signal) is recorded for each process to be performed in the material processing system, and a series of normal excitation signals are determined. For example, a substrate of given type, material and size, is loaded. Thereafter, the excitation signal is recorded for the system when the substrate is located at the load/unload position and the process position (as specified by the process recipe). These two normal excitation signals indicate a normal status for substrate loading/unloading and substrate processing, respectively. Moreover, the substrate can be removed and the above measurements repeated. Following this procedure, a normal substrate presence, a normal substrate type, a normal substrate location, a normal chamber assembly status and a normal consumable status can be determined and recorded within control system 80. For example, Table I will be used below to represent the normal substrate location for recipes at different electrode spacings. Once the normal excitation signals corresponding to the normal excitation statuses are determined, a method of monitoring the equipment status can be described.

Figure 11:
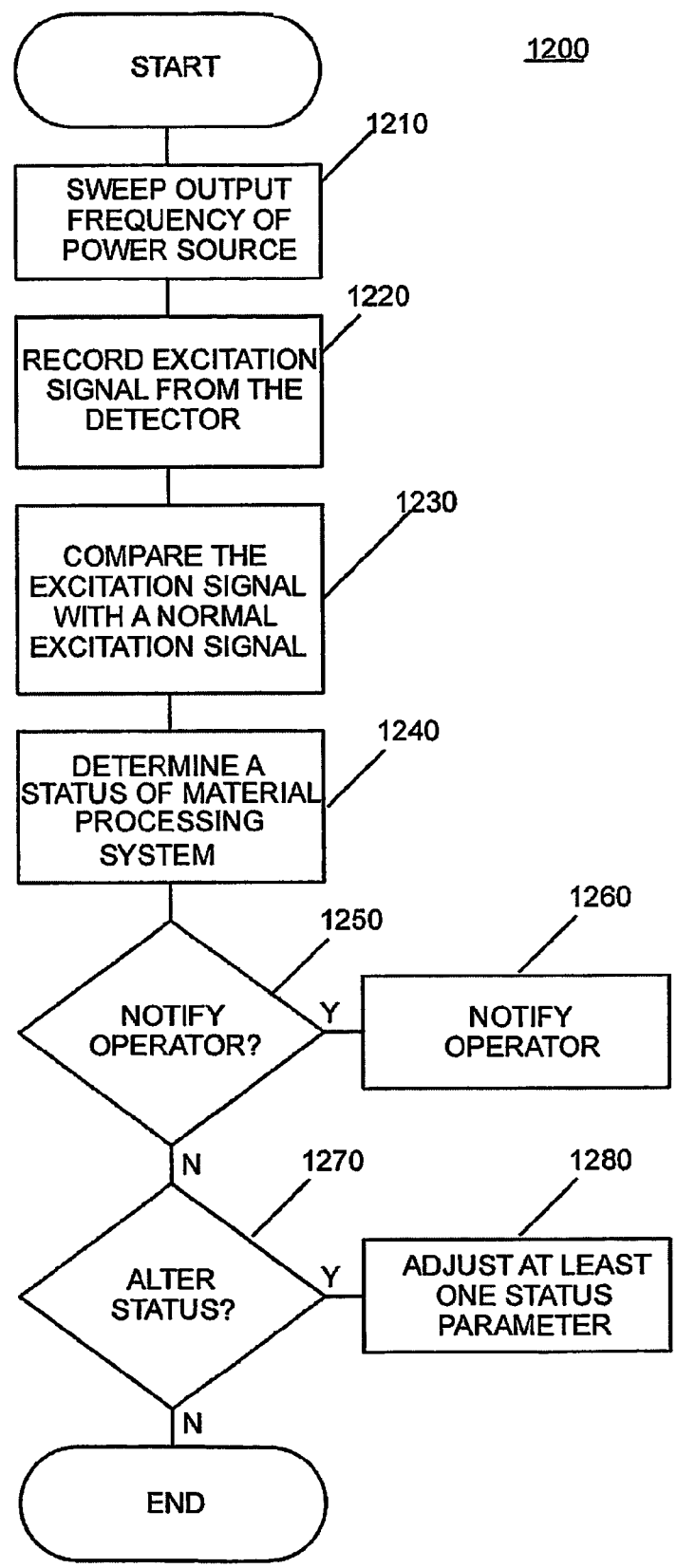
FIG. 11 is a flow diagram of a method of monitoring equipment status in a material processing chamber according to an embodiment of the present invention.

FIG. 11 is a flowchart 1200 of a method of monitoring the equipment status by measuring an excitation signal. The process begins with step 1210, wherein the varactor bias voltage for the power source 60 is swept according to either a periodic (i.e. saw-tooth) or a periodic function in time. In step 1220, the excitation signal detected by detector 70 is recorded by control system 80. For example, the detector may record that the FSR=3.75 GHz when the process recipe calls for a 40 mm electrode spacing. In step 1230, the measured excitation signal is compared to a normal excitation signal and, depending on the nature of the differences as described above (if any), the equipment status is determined relative to the normal status in step 1240. Thus, in the continuing example, the method would determine that the values for FSR are more similar to a 45 mm spacing than a 40 mm spacing, representing a misplacement of the chuck. Using the equipment status, step 1250 proceeds to perform a decision on whether to notify the system operator in step 1260. In the continuing example, the operator is notified of the misplacement of the chuck and given the opportunity to tell the system to correct the error. Step 1270 proceeds to perform a decision on whether to alter the equipment status in step 1280. In step 1280, at least one of a substrate presence, a substrate type, a substrate location, a chamber assembly status, and a consumable status is adjusted. For example, if requested by the operator, the chuck would be moved from the incorrect 45 mm spacing to the recipe-specific 40 mm spacing.

A substrate presence can be altered, for example, by loading a substrate; a substrate type can be altered, for example, by replacing the current substrate with a substrate comprising a different material or of a different size; a substrate location can be altered, for example, by verifying the current chuck position and translating the chuck to a different position; a chamber assembly status can be altered, for example, by verifying proper chamber assembly and performing necessary corrective action; and a consumable status can be altered, for example, by replacing at least one consumable element.

Figure 12:
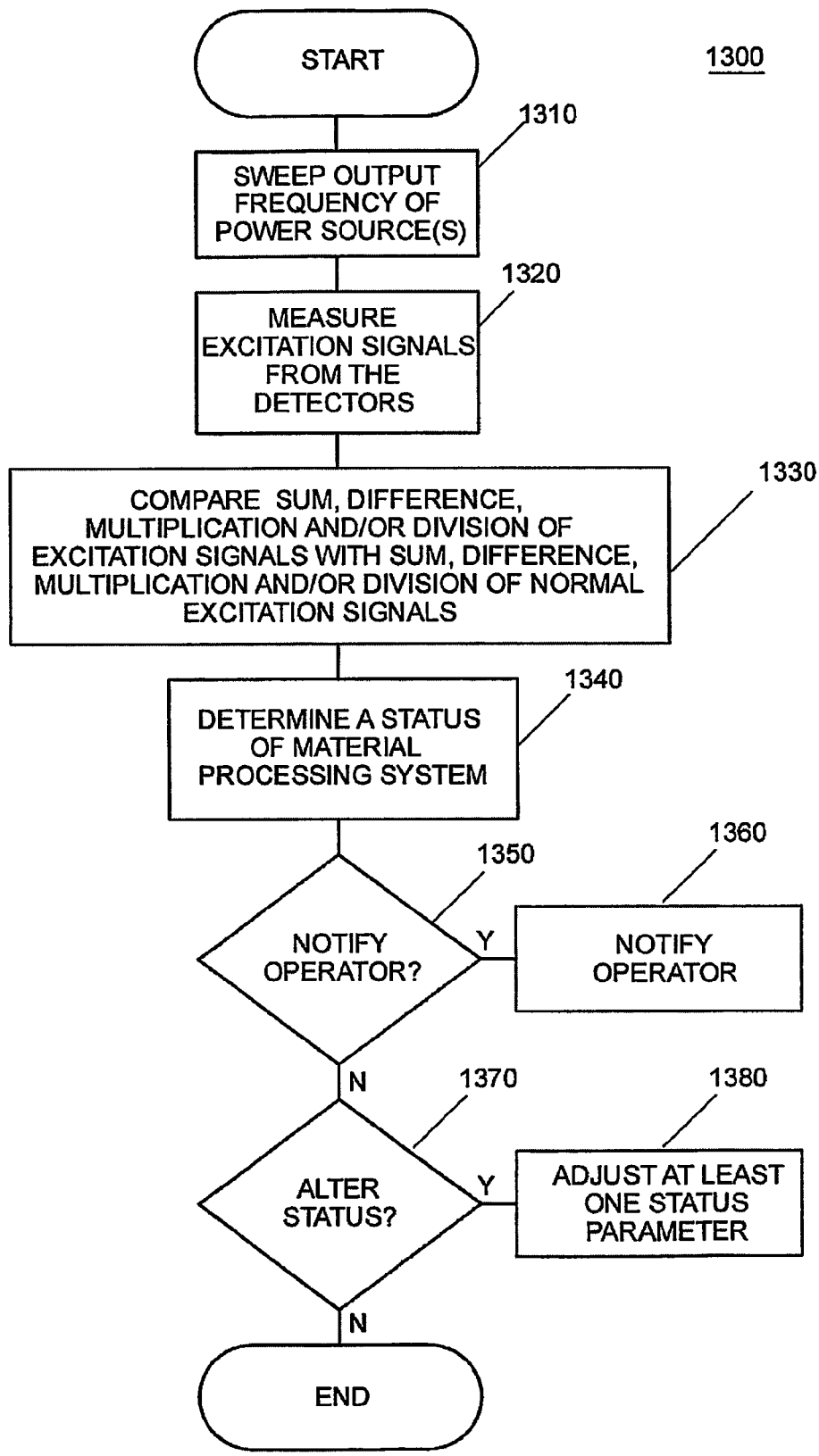
FIG. 12 is a flow diagram of a method of monitoring equipment status in a material processing chamber according to an embodiment of the present invention.

FIG. 12 is a flowchart 1300 of a method of monitoring the equipment status by measuring a plurality of excitation signals. The process begins with step 1310, wherein the varactor bias voltage for the one or more power sources 160 is swept according to either a periodic (i.e. saw-tooth) or a periodic function in time. In step 1320, the excitation signals detected by the detectors 170 in multi-modal resonators 130(*a-c*) are measured by control system 180. In step 1330, at least one of a sum, difference, multiplication and division of the measured excitation signals is compared to at least one of a sum, difference, multiplication and division of the normal excitation signals corresponding to a normal status and, depending on the nature of the differences as described above (if any), the equipment status is determined relative to the normal status in step 1340. Using the equipment status, step 1350 proceeds to perform a decision on whether to notify the system operator in step 1360, and step 1370 proceeds to perform a decision on whether to alter the equipment status in step 1380. In step 1380, at least one of a substrate presence, a substrate type, a substrate location, a chamber assembly status, and a consumable status is adjusted.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

The invention claimed is:

1. An equipment status monitoring system comprising:
   a plasma chamber;
   at least one multi-modal resonator, wherein said multi-modal resonator comprises a first reflecting surface, said first reflecting surface arranged opposite a second reflecting surface, wherein one of said first and second reflecting surfaces are adapted to be provided within said plasma chamber;
   a power source coupled to at least one of said first reflecting surface and second reflecting surface of said at least one multi-modal resonator, said power source being configured to produce an excitation signal extending along an axis generally perpendicular to a substrate holder in the plasma chamber;
   a detector coupled to said at least one multi-modal resonator, said detector being configured to measure said excitation signal; and
   a control system connected to said detector and configured to provide a comparison of at least one measured excitation signal with a normal excitation signal corresponding to a normal status, wherein said comparison determines an equipment status.

2. The equipment status monitoring system according to claim 1, wherein said equipment status includes at least one of substrate presence, substrate type, substrate location, chamber assembly status, and consumable status.

3. The equipment status monitoring system according to claim 1, wherein said normal excitation signal comprises an excitation signal associated with at least one of normal substrate presence, normal substrate type, normal substrate location, normal chamber assembly status, and normal consumable status.

4. The equipment status monitoring system according to claim 1, wherein said excitation signal is one of a voltage, current and power representing a microwave power transmitted through said multi-modal resonator.

5. The equipment status monitoring system according to claim 1, wherein said excitation signal is a spectrum comprising at least one modal frequency.

6. The equipment status monitoring system according to claim 1, wherein said comparison of at least one measured excitation signal with a normal excitation signal comprises a comparison of signal amplitude.

7. The equipment status monitoring system according to claim 6, wherein said comparison of signal amplitude comprises comparing at least one modal amplitude in said at least one measured excitation signal to at least one modal amplitude in said normal excitation signal.

8. The equipment status monitoring system according to claim 6, wherein said comparison of signal amplitude comprises comparing at least one ratio of a first modal amplitude in said at least one measured excitation signal and a second modal amplitude in said at least one measured excitation signal to at least one ratio of a first modal amplitude in said normal excitation signal and a second modal amplitude in said normal excitation signal.

9. The equipment status monitoring system according to claim 1, wherein said comparison of at least one measured excitation signal with a nonnal excitation signal comprises a comparison of at least one of signal frequency and free spectral range.

10. The equipment status monitoring system according to claim 1, wherein said comparison of at least one measured excitation signal with a normal excitation signal comprises a comparison of signal quality factor.

11. The equipment status monitoring system according to claim 10, wherein said signal quality factor corresponds to a quality factor of at least one resonance mode.

12. The equipment status monitoring system according to claim 1, wherein said comparison of at least one measured excitation signal with a normal excitation signal comprises a comparison of an integrated signal.

13. The equipment status monitoring system according to claim 12, wherein said comparison of said integrated signal comprises a comparison of at least one of a zeroth moment, a first moment, a second moment and a third moment of said at least one measured excitation signal and said normal excitation signal.

14. The equipment status monitoring system according to claim 1, wherein said comparison of at least one measured excitation signal with a normal excitation signal comprises a comparison of a differentiated signal.

15. The equipment status monitoring system according to claim 14, wherein said comparison of the differentiated signal comprises a comparison of at least one slope in said at least one measured excitation signal with at least one slope in said normal excitation signal.

16. A method of monitoring a status of a material processing system, said material processing system including a chamber, at least one multi-modal resonator comprising a first reflecting surface, said first reflecting surface arranged opposite a second reflecting surface, wherein one of said first and second reflecting surfaces are adapted to be provided within said chamber, a power source coupled to said multi-modal resonator, and a detector coupled to said multi-modal resonator, said method comprising:
   sweeping an output frequency of said power source to produce an excitation signal extending along an axis generally perpendicular to a substrate holder in the material processing system;
   recording said excitation signal from said multi-modal resonator;
   comparing said excitation signal with a normal excitation signal, wherein said normal excitation signal corresponds to a normal status of said material processing system;
   determining said status of said material processing system from said comparing; and
   providing said status to at least one of an operator and a control system for the material processing system.

17. The method according to claim 16, wherein said status of said material processing system includes at least one of substrate presence, substrate type, substrate location, chamber assembly status, and consumable status.

18. The method according to claim 16, wherein said normal status of said material processing system corresponds to at least one of normal substrate presence, normal substrate type, normal substrate location, normal chamber assembly status, and normal consumable status.

19. The method according to claim 16, wherein the method further includes altering said status of said material processing system by adjusting at least one of said substrate presence, said substrate type, said substrate location, said chamber assembly status, and said consumable status.

20. The method according to claim 16, wherein said sweeping said output frequency of said power source comprises varying an input bias voltage of said power source according to at least one of a periodic and an a periodic function.

21. The method according to claim 16, wherein said excitation signal is a voltage proportional to a power transmitted through said multi-modal resonator.

22. The equipment status monitoring system according to claim 16, wherein said excitation signal is a spectrum comprising at least one modal frequency.

23. The method according to claim 16, wherein said comparing said excitation signal with said normal excitation signal comprises comparing a signal amplitude.

24. The method according to claim 23, wherein said comparing a signal amplitude comprises comparing at least one modal amplitude in said excitation signal to at least one modal amplitude in said normal excitation signal.

25. The method according to claim 23, wherein said comparing a signal amplitude comprises comparing at least one ratio of a first modal amplitude in said excitation signal and a second modal amplitude in said excitation signal to at least one ratio of a first modal amplitude in said normal excitation signal and a second modal amplitude in said normal excitation signal.

26. The method according to claim 16, wherein said comparing said excitation signal with said normal excitation signal comprises a comparison of at least one of signal frequency and free spectral range.

27. The method according to claim 16, wherein said comparing said excitation signal with said normal excitation signal comprises a comparison of signal quality factor.

28. The method according to claim 27, wherein said signal quality factor corresponds to a quality factor of at least one resonance mode.

29. The method according to claim 16, wherein said comparing said excitation signal with said normal excitation signal comprises a comparison of an integrated signal.

30. The method according to claim 29, wherein said comparison of said integrated signal comprises a comparison of at least one of a zeroth moment, a first moment, a second moment and a third moment of said excitation signal and said normal excitation signal.

31. An equipment status monitoring system, said equipment status monitoring system comprising:
a plasma chamber including a substrate holder;
plural multi-modal resonators configured to produce excitation signals, wherein each of said plural multi-modal resonators comprises a first reflecting surface, said first reflecting surface arranged opposite a second reflecting surface, wherein at least one of said first and second reflecting surfaces are adapted to be provided within said plasma chamber, a power source coupled to at least one of said plural multi-modal resonators, said plural multi-modal resonators being configured to produce excitation signals extending along an axis generally perpendicular to a substrate holder in the plasma chamber, a detector coupled to each of said plural multi-modal resonators; and
a control system connected to each detector and configured to provide a measurement of said excitation signals corresponding to a normal status.

32. An equipment status monitoring system according to claim 31, wherein said control system is further configured to provide a measurement of said excitation signals corresponding to a status during processing.

33. An equipment status monitoring system according to claim 32, wherein said control system is further configured to provide a comparison of said excitation signals corresponding to said status during process with said excitation signals corresponding to said normal status.

34. An equipment status monitoring system according to claim 33, wherein said comparison comprises a comparison of at least one of a sum, difference, multiplication and division of said excitation signals corresponding to said status during processing with at least one of a sum, difference, multiplication and division of said excitation signals corresponding to said normal status.

35. An equipment status monitoring system, said equipment status monitoring system comprising:
plural multi-modal resonators configured to produce excitation signals, wherein each of said plural multi-modal resonators comprises a first reflecting surface, said first reflecting surface arranged opposite a second reflecting surface, a power source coupled to at least one of said plural multi-modal resonators, said plural multi-modal resonators being configured to produce excitation signals extending along an axis generally perpendicular to a substrate holder in a processing system to be monitored, a detector coupled to each of said plural multi-modal resonators; and
a control system connected to each detector and configured to provide a measurement of said excitation signals corresponding to a normal status.

36. An equipment status monitoring system, said equipment status monitoring system comprising:
at least one multi-modal resonator, wherein said multi-modal resonator comprises a first reflecting surface, said first reflecting surface arranged opposite a second reflecting surface;
a power source coupled to at least one of said first reflecting surface and second reflecting surface of said at least one multi-modal resonator, said power source being configured to produce an excitation signal extending along an axis generally perpendicular to a substrate holder in a processing system to be monitored;
a detector coupled to said at least one multi-modal resonator, said detector being configured to measure said excitation signal; and
a control system connected to said detector and configured to provide a comparison of at least one measured excitation signal with a normal excitation signal corresponding to a normal status, wherein said comparison determines an equipment status.

* * * * *